US009627269B2

(12) United States Patent
Zhao

(10) Patent No.: US 9,627,269 B2
(45) Date of Patent: Apr. 18, 2017

(54) TRANSISTOR AND FABRICATION METHOD THEREOF

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/920,193

(22) Filed: Oct. 22, 2015

(65) Prior Publication Data

US 2016/0126338 A1 May 5, 2016

(30) Foreign Application Priority Data

Oct. 30, 2014 (CN) .......................... 2014 1 0599013

(51) Int. Cl.

*H01L 21/8238* (2006.01)
*H01L 27/092* (2006.01)
*H01L 21/8234* (2006.01)
*H01L 27/088* (2006.01)
*H01L 29/66* (2006.01)
*H01L 29/78* (2006.01)
*H01L 29/165* (2006.01)

(52) U.S. Cl.

CPC ................ *H01L 21/823821* (2013.01); *H01L 21/823431* (2013.01); *H01L 27/0886* (2013.01); *H01L 27/0924* (2013.01); *H01L 29/66545* (2013.01); *H01L 29/66795* (2013.01); *H01L 29/7848* (2013.01); *H01L 29/7851* (2013.01); *H01L 29/165* (2013.01)

(58) Field of Classification Search

None

See application file for complete search history.

(56) References Cited

U.S. PATENT DOCUMENTS

2013/0228876 A1* 9/2013 Mor .................. H01L 29/66545 257/401
2015/0126012 A1* 5/2015 Jeong ................ H01L 29/66628 438/300

* cited by examiner

*Primary Examiner* — Shaun Campbell
*Assistant Examiner* — Aaron Dehne
(74) *Attorney, Agent, or Firm* — Anova Law Group, PLLC

(57) ABSTRACT

A method for forming transistors is provided. The method includes providing a substrate having a base and at least a fin on the base; and forming a gate layer on the fin, the gate layer has first side surfaces parallel to a longitudinal direction of the fin and second side surfaces perpendicular to the fin. The method also includes forming a protective layer on the first side surfaces of the gate layer to protect a vertex of the top of the gate layer from having EPI particles; and forming sidewall spacers on side surfaces of the protective layer and the second side surfaces of the gate layer. Further, the method includes forming a stress layer in the fin at both sides of the sidewall spacers and the gate layer.

20 Claims, 10 Drawing Sheets

S101 Providing a substrate with a plurality of fins and an insulation layer

S102 Forming a gate film and an initial mask layer

S103 Forming an initial gate layer

S104 Thinning the initial gate layer

S105 Forming a protective layer

S106 Forming a gate layer and a mask layer

S107 Forming a sidewall film

S108 Forming a first sidewall spacer and a first stress layer

S109 Forming a second sidewall spacer and a second stress layer

FIG. 19

TRANSISTOR AND FABRICATION METHOD THEREOF

CROSS-REFERENCES TO RELATED APPLICATIONS

This application claims the priority of Chinese patent application No. 201410599013.5, filed on Oct. 30, 2014, the entirety of which is incorporated herein by reference.

FIELD OF THE INVENTION

The present invention generally relates to the field of semiconductor manufacturing technology and, more particularly, to transistors and fabrication processes thereof.

BACKGROUND

With the rapid development of semiconductor manufacturing technology, semiconductor devices have been developed in the direction of higher component density and higher integration level. As basic semiconductor devices, transistors are currently being widely used. With the increase of the component density and integration level, the gate size of transistors has become shorter than ever. However, decreasing the gate size could cause a short channel effect, and leakage current may be generated. Thus, the electrical properties of semiconductor devices are affected. Currently, the prior art methods to improve the performance of semiconductor devices mainly depends on increasing the carrier mobility. When the carrier mobility is increased, the drive current of a transistor increases; and the leakage current decreases. Increasing stress in the channel region of a transistor is a key to improve the carrier mobility. Therefore, increasing the stress in the channel region of a transistor may significantly improve the performance of the transistor.

Forming a stress layer in the source region and drain region is one of the several approaches to increase the carrier mobility of the channel region of a transistor because the stress layer may induce stress to the channel region of the transistor. The stress layer of the PMOS transistor may be made of silicon germanium (SiGe). Silicon germanium and silicon share a same lattice structure, i.e., a "diamond" configuration, and at room temperature, the lattice constant of silicon germanium is larger than that of silicon. Therefore, there is a crystal lattice mismatch between silicon and the embedded silicon germanium structures. Such a mismatch may provide a compressive stress to the channel region of the transistor; and thus improve the carrier mobility of the channel region. Similarly, the stress layer of the NMOS transistor may be made of silicon carbide (SiC). At room temperature, the smaller lattice constant of silicon carbide than silicon causes a crystal lattice mismatch between silicon carbide and silicon. Therefore, a tensile stress may be generated to the channel region of the transistor, the carrier mobility of the channel region may be increased; and the performance of the NMOS transistor may be enhanced.

However, the existing transistor having a stress layer in the source region and the drain region have certain issues, such as the quality of morphology, and the stability of performance, etc. The disclosed device structures and methods are directed to at least partially solve one or more problems set forth above and other problems.

BRIEF SUMMARY OF THE DISCLOSURE

One aspect of the present disclosure includes a method for fabricating transistors. The method includes providing a substrate having a base and at least a fin on the base; and forming a gate layer on the fin, the gate layer has first side surfaces parallel to a longitudinal direction of the fin and second side surfaces perpendicular to the longitudinal direction of the fin. The method also includes forming a protective layer on the first side surfaces of the gate layer to protect vertexes of the top of the gate layer from having EPI particles; and forming sidewall spacers on side surfaces of the protective layer and the second side surfaces of the gate layer. Further, the method includes forming a stress layer in the fin at both sides of the sidewall spacer and the gate layer.

Another aspect of the present disclosure includes a semiconductor structure having at least a transistor. The semiconductor structure includes a substrate having a base and at least a fin on the base; and a gate layer having first side surfaces parallel a longitudinal direction of the fin and second side surfaces perpendicular to the longitudinal direction of the fin formed on the fin. The semiconductor structure also includes a protective layer formed on the first side surfaces of the gate layer to protect the gate layer from having EPI particles; and a sidewall spacer formed on side surfaces of the protective layer and the gate layer. Further, the semiconductor structure includes a stress layer formed in the fin at both sides of the sidewall spacers and the gate layer.

Other aspects of the present disclosure can be understood by those skilled in the art in light of the description, the claims, and the drawings of the present disclosure.

BRIEF DESCRIPTION OF THE DRAWINGS

FIG. 19 illustrates an exemplary fabrication process of transistors consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
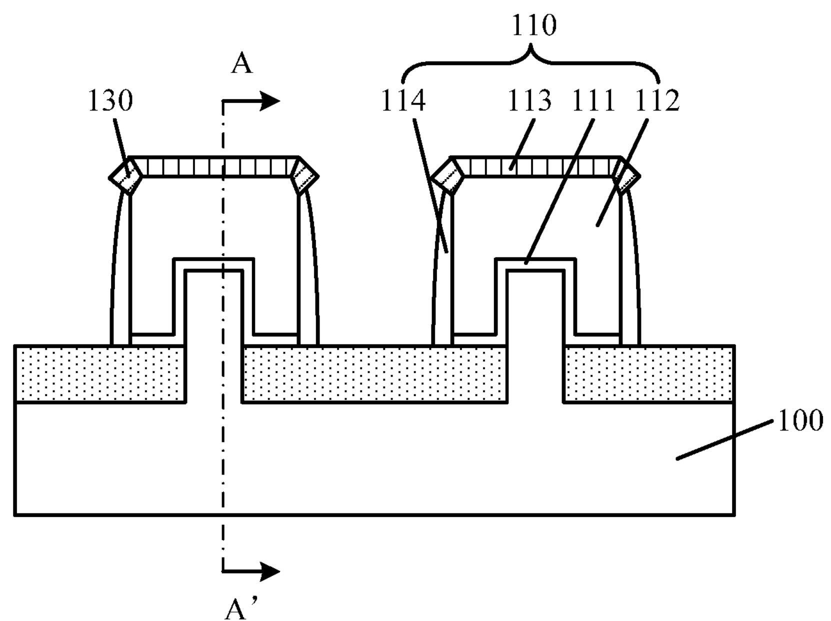
FIGS. 1~2 illustrate structures corresponding to existing transistors having a stress layer in the source region and the drain region.
Figure 2:
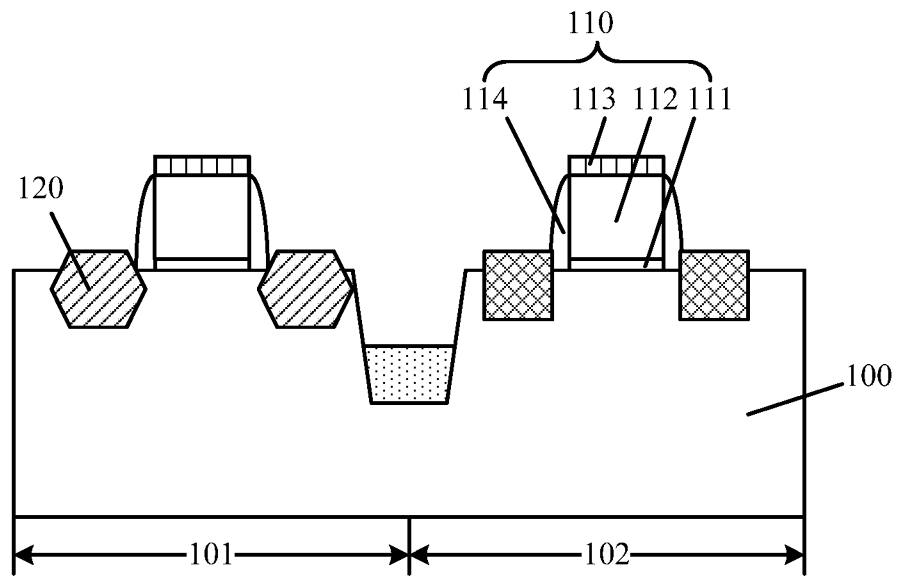

FIGS. 1~2 illustrate an existing transistor structure having a stress layer in the source region and the drain region. FIG. 2 is the cross-sectional view of the transistor structure illustrated in FIG. 1 along the "AA'" direction.

As shown in FIGS. 1-2, the transistor structure includes a substrate 100; a plurality of gate structures 110 formed on the substrate 100. The gate structure 110 includes a gate dielectric layer 111 formed on the substrate 100; a gate layer 112 formed on the surface of the gate dielectric layer 111; a mask layer 113 formed on the surface of the gate layer 112; a sidewall spacer 114 formed on the sidewalls of the gate dielectric layer 111, the gate layer 112 and the mask layer 113; and a stress layer 120 formed in the substrate at both sides of the gate structure 110. The gate layer 112 may be made of polysilicon; and may be used as the gate of the transistor as well as the dummy gate to occupy the space for the subsequently forming a metal gate.

A process for forming the stress layer 120 includes forming openings in the substrate 100 at both sides of the gate structure 110 after forming the gate structure 110 on the substrate 100. Then, the stress layer 120 is formed by a selective epitaxial deposition process within the openings.

In one embodiment, the substrate 100 includes a first region 101 and a second region 102. Because the first region 101 may be used to form a PMOS transistor while the second region 102 may be used to form an NMOS transistor, the materials for the stress layer 120 formed in the first region 101 and the second region 102 are different. For example, the materials may be SiGe and SiC, respectively.

With continuously shrinking of the critical dimension of semiconductor devices, the etching mask used for forming the openings and the stress layer 120 may expose portion of the surface of substrate 100 used to form the stress layer 120 at both sides of the gate structure 110. Further the gate structure 110 may also be exposed. The top surface of the gate layer 112 is protected by the mask layer 113, and the side surfaces of the gate layer 112 are protected by the sidewall spacer 114. The exposed area of the surface of the substrate 100 may be relatively large. Such a relatively large may ensure the accuracy of a lithography process for forming the etching mask. Thus, the size and morphology of the exposed area may be accurate.

However, during the formation of the stress layer 120 by a selective epitaxial deposition process, because the gate structure 110 may be exposed, and as the semiconductor devices shrink in size, the thicknesses of the mask layer 113 and the sidewall spacer 114 may be reduced. Especially in the formation of the sidewall spacer 114 with an etch-back process, the vertexes of the top of the gate layer 112 may be exposed on the top of the sidewall spacer 114, causing a reaction of the processing gases used to form the stress layer 120 at the vertexs of the top of the gate layer 112. Therefore, the selective epitaxial deposition process not only forms the stress layer 120 in the openings, but also forms EPI particles 130 (also called as Mushroom defect) on the surfaces of the vertexes of the top of the gate layer 112. Since the EPI particles 130 and the stress layer 120 may be made of a same material, i.e., semiconductor material, the EPI particles 130 may easily cause a leakage current on the top of the gate layer 112 or the metal gate, resulting in unstable performance, deteriorated reliability, and decreased yield of the transistors, etc.

Further, as illustrated in FIG. 1, a cross-sectional view of the transistor structure perpendicular to the fins, the substrate may include a base (not labelled); a plurality of fins (not labelled) formed on the base; and an insulation layer (not labelled) formed on the base, covering portions of the side surfaces of the fins, with its surface lower than the top surface of the fins. The plurality of fins are parallel to each other, the distance between two gate structures 110 on the surface of two adjacent and parallel fins is relatively small, and the aspect ratio of the trenches between two gate structures is relatively large. Therefore, during the formation of sidewall spacer 114 by an etch-back process, along a direction parallel to the longitudinal direction of the fins, portions of the mask layer 113 covering the surface of the vertexes of the top of the gate layer 112 and the sidewall spacer 114 are more likely to be consumed, the vertexes of the top of the gate layer 112 along the direction parallel to the longitudinal direction of fins are more likely to be exposed, and EPI particles 130 are more likely to grow on the surfaces of the vertexes of the gate layer 112 along the longitudinal direction of the fins. According to the disclosed device structures and methods, the above mentioned problems and other issues may be overcome by forming a protective layer on top portions of the side surfaces of the gate layer or the entire side surfaces of the gate layer.

FIG. 19 illustrates an exemplary fabrication process of a semiconductor structure having a plurality of transistors consistent with the disclosed embodiments; and FIGS. 3-14 illustrate semiconductor structures corresponding to certain stages of the exemplary fabrication process.

Figure 3:
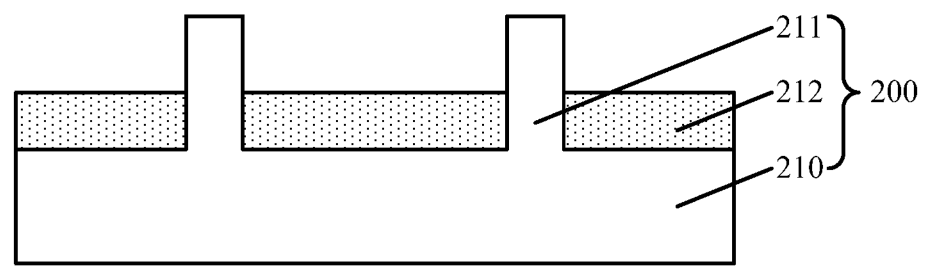
FIGS. 3~14 illustrate semiconductor structures corresponding to certain stages of an exemplary fabrication process of transistors consistent with the disclosed embodiments.

As shown in FIG. 19, at the beginning of the fabrication process, a substrate with certain structures is provided (S101). FIG. 3 illustrates a corresponding structure.

As shown in FIG. 3, a substrate 200 is provided. The substrate 200 may include a base 210; a plurality of fins 211 formed on the base 210; and an insulation layer 212 formed on the base 210. The insulation layer 212 may cover portions of the side surfaces of the fins 211; and the top surface of the insulation layer 212 may be lower than the top surface of the fins 211. Some structures may be omitted; and certain other structure may be included in the substrate 200. The number of the fins 211 may be one, or more than one. For illustrative purposes, two fins 211 are described.

In one embodiment, the substrate 200 may include a first region I and a second region II. The first region I may be used to form a PMOS transistor while the second region II may be used to form an NMOS transistor. In certain other embodiments, the first region I may be used to form core devices while the second region II may be used to form peripheral devices, such as input and output (110) devices, etc. The first region I and the second region II may be adjacent, or may be separated.

In one embodiment, the base 210 and fins 211 may be formed by etching a semiconductor substrate. The semiconductor substrate may be made of any appropriate semiconductor materials, including silicon, silicon germanium, silicon carbon, silicon on insulator (SOI) and germanium on insulator (GOI), etc. By etching portions of the semiconductor substrate, a plurality of trenches may be formed in the semiconductor substrate. The portions of the semiconductor substrate between two adjacent trenches may form the fins 211; and the semiconductor substrate at the bottom of the fins 211 may form the base 210. The semiconductor substrate may be etched by any appropriate process, such as a dry etching process, a wet etching process, or an ion beam etching process, etc.

In certain other embodiments, the plurality of fins 211 may be formed on the base 210 by a selective epitaxial growth process. The base 210 may be made of silicon, silicon germanium, silicon carbon, silicon on insulator (SOI) and germanium on insulator (GOI); and the fins 211 may be made of silicon, silicon germanium, or silicon carbon, etc. The materials for the fins 211 and the base 210 may be the same, or different.

In one embodiment, a process for forming the plurality of fins 211 on the base 210 may include forming an epitaxial fin layer on the base 210; and followed by forming a plurality of trenches in the epitaxial fin layer by etching the epitaxial fin layer until the surface of the base 210 is exposed. Thus, the fins 211 may be formed between trenches.

In certain other embodiments, a process for forming the plurality of fins 211 may include forming an insulation layer on the base 210; forming a plurality of trenches in the insulation layer by etching the insulation layer until the surface of the base 210 is exposed; forming a plurality of fins 211 in the trenches by an epitaxial growth process; and etching the insulation layer until its surface is lower than the top surface of the fins 211.

Figure 4:
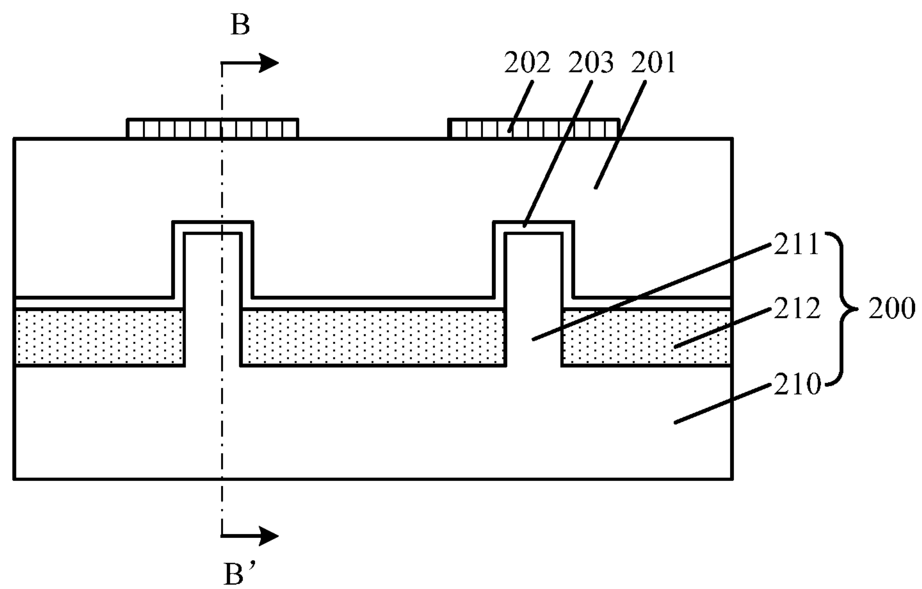
Figure 5:
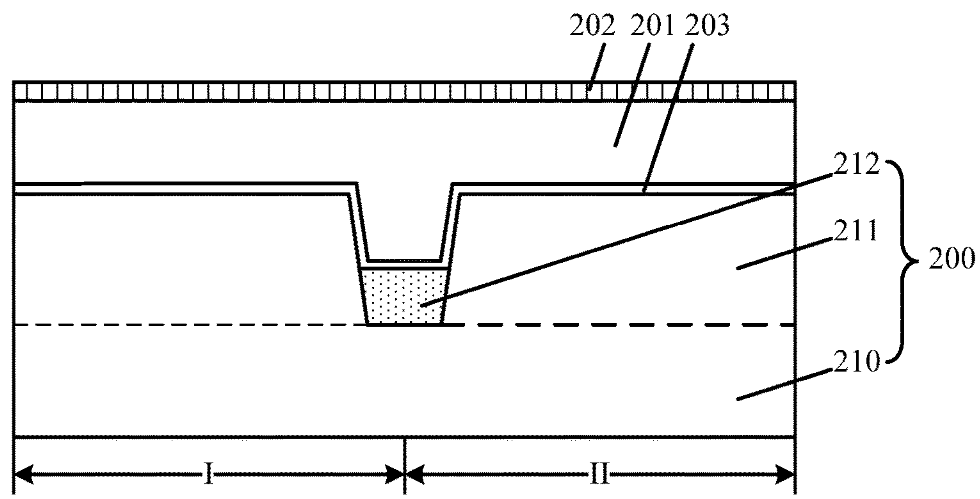

Returning to FIG. 19, after providing the substrate 200 with the fins 211, a gate film and an initial mask layer may be formed (S102). FIGS. 4-5 illustrate a corresponding semiconductor structure; and FIG. 5 is a cross-sectional view of the structure illustrated in FIG. 4 along the "BB'" direction.

As shown in FIGS. 4~5, a gate film 201 is formed on the surfaces of the insulation layer 212 and the fins 211; and an initial mask layer 202 is formed on the surface of the gate film 201. The projective view of the fins 211 on the surface of the base 210 is within the projective view of the initial mask layer 202 on the surface of the base 210. That is, the width of the initial mask layer 202 may be greater than the width of the fin 211.

FIG. 5 also illustrates the first region I and the second region II. Such two regions may be adjacent; or may be separated.

The gate film 201 may cover the surface of the insulation layer 212, and the side and the top surfaces of the fins 211. The gate film 201 may be made of any appropriate material, such as amorphous silicon, or polysilicon, etc. The thickness of the gate film 201 may be in a range of approximately 500 Å~1500 Å.

In one embodiment, referring to FIGS. 4-5, a gate dielectric film 203 may be formed between the gate layer 201 and the fins 211 and the insulation layer 212. The gate dielectric film 203 may be made of silicon oxide, etc. In certain other embodiments, the gate dielectric film 203 may be also made of silicon nitride or silicon oxynitride, etc.

In one embodiment, the transistor to be formed is a transistor with a high-K metal gate (HKMG) structure. The subsequently formed gate structure may be made of metal. Thus, the gate film 201 may be used as a dummy gate structure to occupy the space needed for the subsequently formed metal gate structure. In a subsequent process, the dummy gate structure may be removed, and replaced by the metal gate structure. Therefore, the thickness of the subsequently formed gate structure may be determined by the thickness of the gate film 201.

Because the amorphous silicon or polysilicon may have good shape retention, and may be easily etched and removed, the dummy gate structure made of amorphous silicon or polysilicon may have well-formed morphology, stable structure, and the ease of being removed.

In certain other embodiments, a high-K dielectric film may be formed between the gate dielectric film 203 and the gate film 201, and between the fins 211 and the gate film 201, and may be used to subsequently form the gate dielectric layer of the high-K metal gate structure of the transistor. In still certain other embodiments, the gate film 201 and the gate dielectric film 203 may be directly used to form the gate layer and gate dielectric layer of the transistor, respectively. Therefore, a source region and a drain region may be subsequently formed in fins 211 at both sides of the gate layer, and a transistor may be formed. The transistor may be referred as a fin field-effect transistor.

The gate dielectric film 203 may be formed by any appropriate process, such as a thermal oxidation process, a chemical vapor deposition (CVD) process, a physical vapor deposition (PVD) process, or an atomic layer deposition (ALD) process, etc. The thickness of the gate dielectric layer film 203 may be a range of approximately 5 Å~30 Å. Various processes may be used to form the gate film 201, such as a CVD process, or a PVD process, etc. The thickness of the gate film 201 may be in a range of approximately 500 Å~1500 Å.

In one embodiment, the mask layer subsequently formed from the initial mask layer 202 may be removed after forming a stress layer. The mask layer may be used to protect the top surface of the subsequently formed gate layer, and to prevent the formation of EPI particles on the surface of the vertexes of the top of a gate layer during the subsequent formation of the stress layer.

The initial mask layer 202 may be made of any appropriate material, such as one or more of SiN, SiON, SiOCN, SiOBN and $SiO_2$, etc. The thickness of the initial mask layer 202 may be in a range of approximately 50 Å~500 Å.

A process for forming the initial mask layer 202 may include, sequentially, forming a mask material film on the surface of the gate film 201; forming a patterned layer covering the corresponding regions used to form the initial mask layer 202 on the surface of the mask material film; and etching the mask material film with the patterned layer as an etching mask to form the initial mask layer 202 until the surface of the gate film 201 is exposed.

The mask material film may be formed by any appropriate process, such as an ALD process, or a CVD process, etc. The patterned layer may be a patterned photoresist layer, or a mask formed by a multiple patterning process, such as self-aligned double patterning (SADP) mask, etc.

Subsequently, the mask layer formed from the initial mask layer 202 may be used to protect the top surface of the gate layer during the formation of the sidewall spacers and the stress layer. Moreover, a mask-less etch-back process may be subsequently used to form sidewall spacers. Therefore, the thickness of the initial mask layer 202 may not be substantially thin. Otherwise, the mask layer may be easily consumed during the formation of the sidewall spacers, likely resulting in the weakening of the protection of the mask layer. Thus, EPI particles may be easily formed on the top surface of the gate layer. On the other hand, the thickness of the initial mask layer 202 may not be significantly thick, likely resulting in poor morphology of the gate layer after an etching process, especially to the surfaces of the gate layer. In one embodiment, the thickness of the initial mask layer 202 may be in a range of approximately 50 Å~500 Å.

Figure 6:
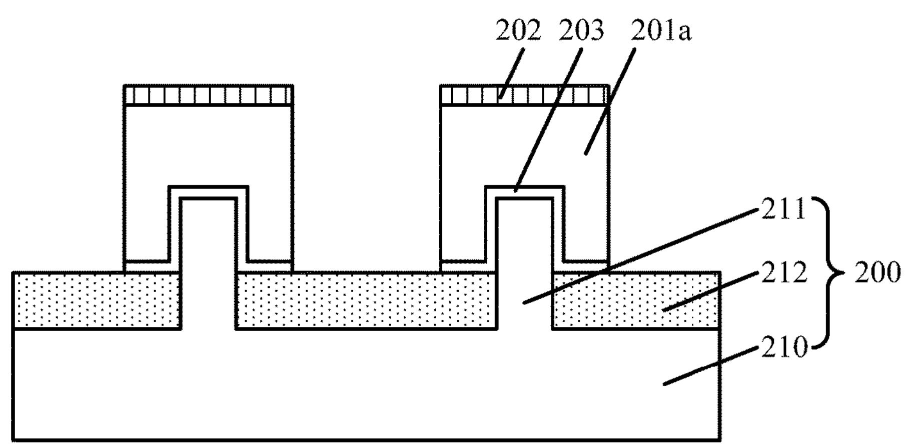

Returning to FIG. 19, after forming the gate film 201 and the initial mask layer 202, an initial gate layer may be formed (S103). FIG. 6 illustrates a corresponding structure.

As shown in FIG. 6, an initial gate layer gate layer 201*a* is formed. The initial gate layer 201*a* may be formed by etching the gate film 201 (as illustrated in FIG. 4 and FIG. 5) using the initial mask layer 202 as the etching mask. The etching process may be stopped when the surface of the insulation layer 212 is exposed.

The etching process may be a dry etching process, a wet etching process, or a combination of a dry etching process and a wet etching process, etc. The etching process of the gate film 201 may be stopped at the surface of the gate dielectric layer 203 (as illustrated in FIG. 4 and FIG. 5), and the gate dielectric layer 203 may protect the surface of the insulation layer 212, and the side and the top surfaces of the fins 211 during the etching process.

In one embodiment, after the gate film 201 is etched, the gate dielectric film 203 is further etched, and the surface of the insulation layer 212, the side and the top surfaces of the fins 211 are exposed. In certain other embodiments, the gate dielectric film 203 is not etched, and may be used as a gate dielectric layer directly.

In certain other embodiments, a high-K dielectric layer (not shown) may also be formed between the gate dielectric film 203 and the gate film 201, and may be used as the gate dielectric material in the high-K metal gate structure of the transistor. After etching the gate film 201, the high-K dielectric layer may be further etched until the surface of the gate dielectric film 203 is exposed. The gate film 201 may be subsequently removed; and a gate structure made of metal material may be formed on the surface of high-K dielectric layer.

Figure 7:
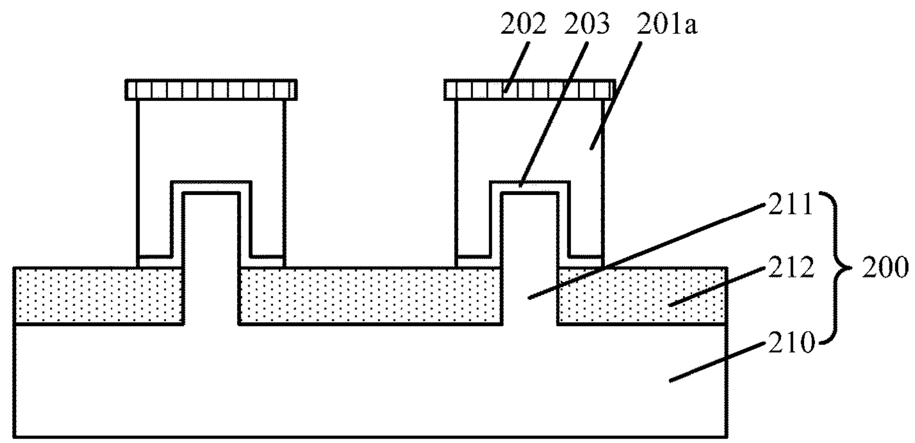

Returning to FIG. 19, after forming the initial gate layer 201*a*, the initial gate layer 201*a* may be thinned (S104). FIG. 7 illustrates a corresponding structure.

As shown in FIG. 7, the initial gate layer 201*a* is thinned. That is, the side surfaces of the gate layer 201*a* may be recessed relative to the side surfaces of the initial mask layer 202. Because the side surfaces of the initial gate layer 201*a* may be recessed relative to the initial mask layer 202, when a protective layer is subsequently formed on the recessed side surfaces of the initial gate layer 201*a*, the initial mask layer 202 may cover the top surface of the protective layer. That is, the protective layer may be connected to the initial mask layer 202. Thus, the vertexes of the top of the initial gate layer 201*a* may be entirely covered by the protective layer and the initial mask layer 202. In one embodiment, if the initial gate layer is made of polysilicon, the process for thinning the initial gate layer 201*a* may be referred as a poly cut process.

Therefore, after subsequently forming sidewall spacers, the vertexes formed by first side surfaces of the thinned initial gate layer 201*a* and the top surface of the initial gate layer 201*a* may not easily be exposed. Further, during the subsequent formation of a stress layer, the EPI particles may be prevented from forming on the vertexes of the top of the initial gate layer 201*a*. Thus, after forming the stress layer, a gate structure with desired morphology may be formed to avoid the leakage current at the vertex of the top of the gate layer. Therefore, the stability of the transistor may be enhanced; and the reaction gas consumption for forming the stress layer may be reduced.

The initial gate layer 201*a* may be thinned for a range of approximately 20 Å~200 Å. Such a range may determine the thickness of the protective layer subsequently formed on the side surfaces of the initial gate layer 201*a*. Thus, it may determine the protective ability of the protective layer to the side surfaces of the initial gate layer 201*a*.

Various processes may be used to thin the initial gate layer 201*a*, such as a dry etching process, or a wet etching process, etc. In one embodiment, the thinning process for the initial gate layer 201*a* is an isotropic etching process. Such a process may be a dry etching process or a wet etching process. In one embodiment, the initial gate layer 201*a* may be made of amorphous silicon or polysilicon, and a wet etching process may be used to thin the initial gate layer 201*a*. The etching solution of the wet etching process may be tetramethylammonium hydroxide solution with a temperature of approximately 10° C.~70° C.

The temperature of the etching solution may determine the etching rate. That is, the higher the temperature is, the greater the etching rate is. Therefore, in one embodiment, in order to control the etching rate, the temperature of the etching solution is approximately 30° C. At 30° C., the etched thickness of the initial gate layer 201*a* may be well controlled; and the etching rate may be high enough to avoid a significantly long time required for thinning the initial gate layer 201*a*.

In certain other embodiments, the thinning process for the initial gate layer 201*a* may be a dry etching process. The etching gas may include one or two of $CH_4$, $CHF_3$, $CH_3F$, $CH_2F_2$, $Cl_2$ and HBr, etc. The dry etching process may be a plasma etching process. The power of the radio frequency plasma may be approximately 1000 W; and the bias power may be lower than approximately 100 W. Such etching parameters may enable the plasma to have a relatively large free path; and may cause the plasma to etch the initial gate layer 201*a* along a direction perpendicular to the side surfaces of the initial gate layer 201*a*. Specifically, the dry etching process may be a remote plasma etching process.

Further, referring to FIG. 7, the initial gate layer 201*a* may be entirely thinned. That is, the entire side surfaces of the initial gate layer 201 are recessed relative to the side surfaces of the initial mask layer 202. In certain other embodiments, only the top portions of the initial gate layer 201*a* may be thinned.

Figure 8:
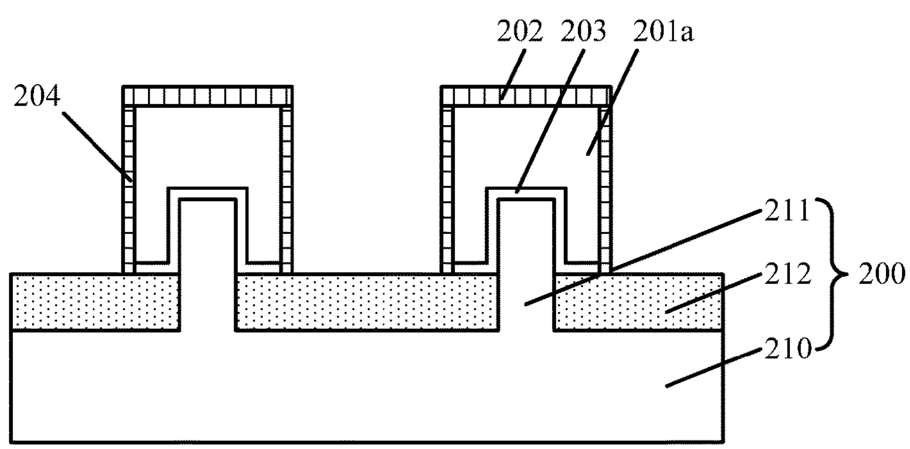

Returning to FIG. 19, after thinning of the initial gate layer 201*a*, a protective layer may be formed (S105). FIG. 8 illustrates a corresponding structure.

As shown in FIG. 8, a protective layer 204 is formed on the side surfaces of the initial gate layer 201*a*. In one embodiment, the proactive layer 204 may entirely cover the side surfaces of the initial gate layer 201*a*. The side surfaces may include first side surfaces of the subsequently formed gate layer. A process for forming the protective layer 204 may include forming a protective film on the surfaces of the insulation layer 212, the side surfaces of the initial gate layer 201*a* and the initial mask layer 202; and performing an etch-back process on the protective film until the top surface of the initial mask layer 202 and the surface of the insulation layer 212 are exposed. Thus, the protective layer 204 may be formed.

The protective layer 204 may be made of any appropriate material, such as one or more of SiN, SiON, SiOBN, SiOCN and $SiO_2$, etc. The thickness of the protective layer 204 may be in a range of approximately 20 Å~200 Å. Various processes may be used to form the protective layer 204, such as an ALD process, or a CVD process, etc. The thickness of the protective layer 204, i.e., the thinned thickness of the initial gate layer 201*a*, may determine the protective ability of the protective layer 204 in the subsequent processes for forming the sidewalls and the stress layer. The protective layer 204 may not be substantially thin, otherwise, it may have an insufficient protective ability; and may be easily consumed in the subsequent processes; and the side surfaces of the initial gate layer 201*a* may be exposed. The protective layer 204 may not be significantly thick; otherwise, the size of the transistor may be relatively large.

In one embodiment, the top of the protective layer 204 formed on the side surfaces of the initial gate layer 201*a* may be able to connect to a portion of the bottom of the initial mask layer 202, making the side and the top surfaces of the initial gate layer 201*a* to be completely covered by the protective layer 204 and the initial mask layer 202. The side surfaces of the initial gate layer 201*a* may be configured as the first side surfaces of the subsequently formed gate layer. During the subsequent formation of sidewall spacers, only the protective layer 204 on the first side surfaces of the gate layer, instead of the second side surfaces of the gate layer, may be exposed, preventing the formation of EPI particles on the surfaces of the vertexes formed by the top surface and the first side surfaces of the initial gate layer 201*a*.

Further, the ALD process or the CVD process used to form the protective layer 204 may have desired coverage, making the protective layer 204 closely conform to the surface of the initial mask layer 202 and the side surfaces the initial gate layer 201*a*. During a subsequent etch-back process, only portions of the protective layer 204 on the surface of the mask layer 202 and the insulation layer 212 may be etched, and portions of the protective layer 204 on the side surfaces of the initial gate layer 201*a* may not be etched due to the protection of the initial mask layer 202. Therefore, the top of the protective layer 204 and the bottom of the mask layer 202 may be connected.

In certain other embodiments, the material of the protective layer 204 may be $SiO_2$. A process for forming the protective layer 204 may include forming a protective film on the side surfaces of the initial gate layer 201*a*, and the side and the top surfaces of the fins 211 by an oxidation process; and followed by forming the protective layer 204 by etching the protective film until the side surfaces and the top surface of fins 211 are exposed. The oxidation process may be a furnace oxidation process or a chemical oxidation process, etc. The protective film may tightly conform to the side surfaces of the initial gate layer 201*a*.

Figure 9:
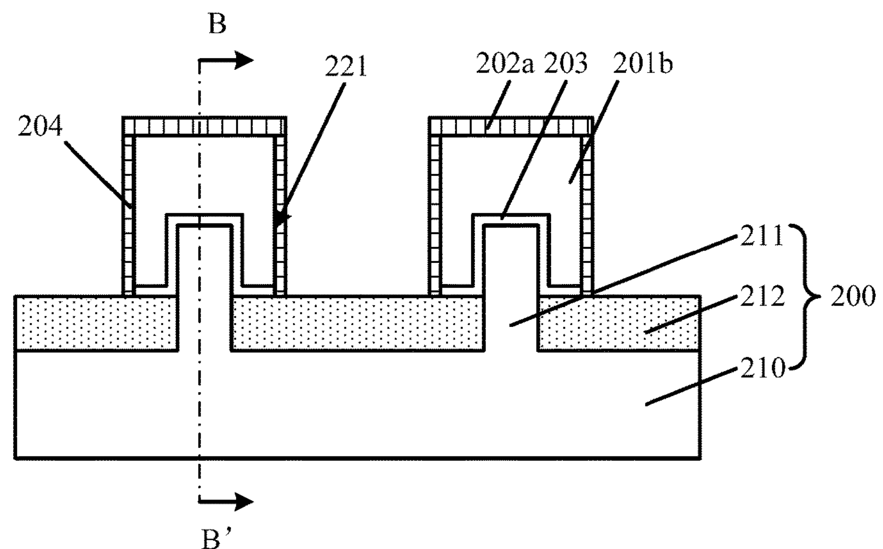
Figure 10:
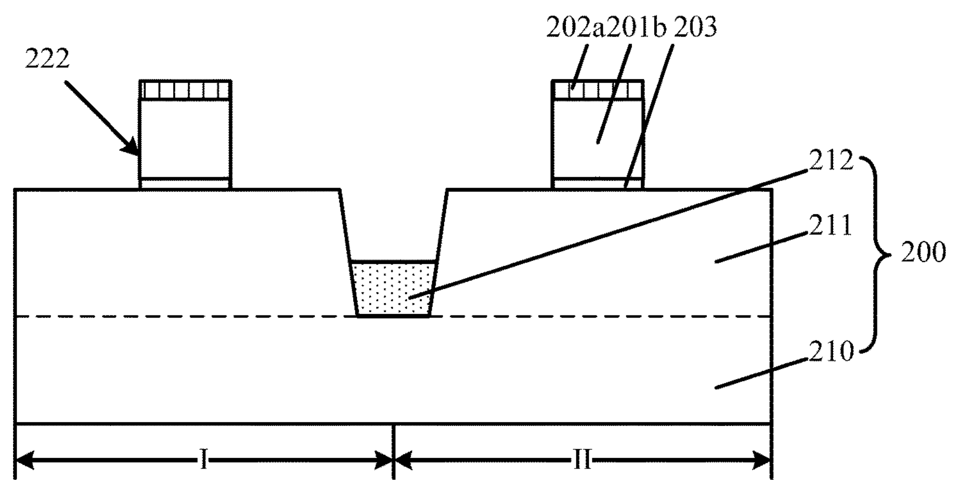

Returning to FIG. 19, after forming the protective layer 204, a gate layer and a mask layer may be formed (S106). FIGS. 9~10 illustrate a corresponding structure; and FIG. 10 is a cross-sectional view of the structure illustrated in FIG. 9 along the "BB'" direction.

As shown in FIGS. 9-10, after forming the protective layer 204, a gate layer 201*b* and a mask layer 202*a* are formed. The gate layer 201*b* and the mask layer 202*a* may be formed by etching the initial mask layer 202 (FIG. 8) and the initial gate layer 201*a* (FIG. 8) until portions of the top and side surfaces of the fins 211 and the surface of the insulation layer 212 are exposed.

The gate layer 201*b* may be over the fins 211, and cover portions of the surface of the insulation layer 212 and the top and side surfaces of the fins 211. The mask layer 202*a* may cover the top surface of the gate layer 201*b*.

Further, as shown in FIGS. 9~10, the gate layer 201*b* may include first side surfaces 221 and second side surfaces 222. The first side surfaces 221 may be parallel to the longitudinal direction of the fins 211; and the second side surfaces 222 may be perpendicular to the longitudinal direction of the fins 211.

The first side surfaces 221 of the gate layer 201*b* may be the side surfaces of the thinned initial gate layer 201*a*. Thus, the first side surfaces 221 may be covered by the protective layer 204. The protective layer 204 and the mask layer 202*a* may be used together to protect the top of the gate layer 201*b* to prevent the formation of EPI particles on the vertexed formed by the first side surfaces 221 and the top surface of the gate layer 201*b* during the subsequent formation of a stress layer.

Meanwhile, the second side surfaces 222 may be formed by etching the initial gate layer 201*a*. Therefore, the second side surfaces 222 may not be covered by a protection layer; and the distance between the second side surfaces 222 of the gate layer 201*b* may be precisely controlled. Further, because the subsequently formed stress layer may be located at both sides of the second side surfaces 222 and the gate layer 201*b*; and the stress layer may be used to form the source region and drain region, the distance between the source region and the drain region may be precisely controlled. That is, the length of the channel region may be precisely controlled. Therefore, the stability and the reliability of the transistor may be enhanced.

A process for forming the gate layer 201*b* and the mask layer 202*a* may include forming a patterned layer on the surface of the initial mask layer 202 to define the pattern and the position of the gate layer 201*b*; and etching the initial mask layer 202 and the initial gate layer 201*a* to form the gate layer 201*b* and the mask layer 202*a* using the patterned layer as an etching mask. The formation process of the initial mask layer 202 and the initial gate layer 201*a* may be similar as that of the initial gate layer 201*a* described as above.

Figure 11:
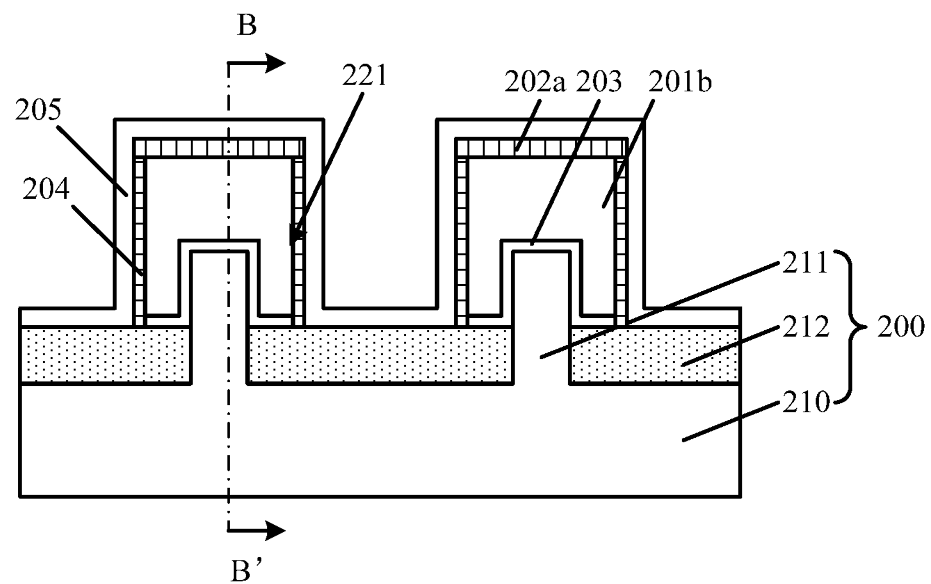
Figure 12:
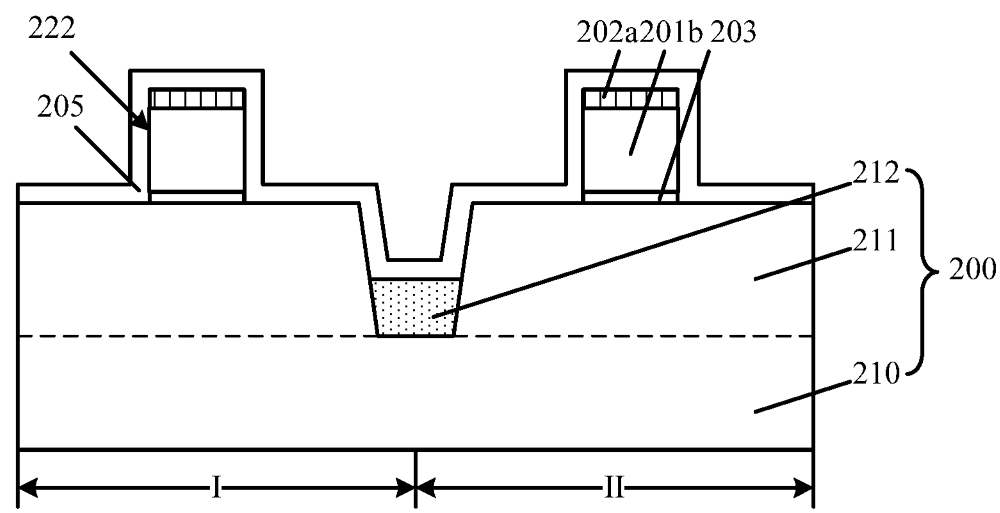

Returning to FIG. 19, after forming the gate layer 201*b* and the mask layer 202*a*, a sidewall spacer film may be formed (S107). FIGS. 11~12 illustrate a corresponding structure; and FIG. 12 illustrates a cross-sectional view of the structure illustrated in FIG. 11 along the "BB'" direction.

As shown in FIGS. 11~2, a sidewall film 205 is formed on the surfaces of the insulation layer 212, the second side surfaces 222 of the gate layer 201*b*, the protective layer 204 and the mask layer 202*a*. The sidewall film 205 may be used to subsequently form the sidewall spacer to define the distance between the source region or the drain region and the gate layer 201*b*.

The sidewall film 205 may be made of any appropriate material, such as one or more of SiN, SiON, SiOBN, and SiOCN, etc. The thickness of the sidewall film 205 may in a range of approximately 20 Å~200 Å. Various processes may be used to form the sidewall film 205, such as an ALD process, a CVD process or a hot furnace thermal oxidation process, etc.

Figure 13:
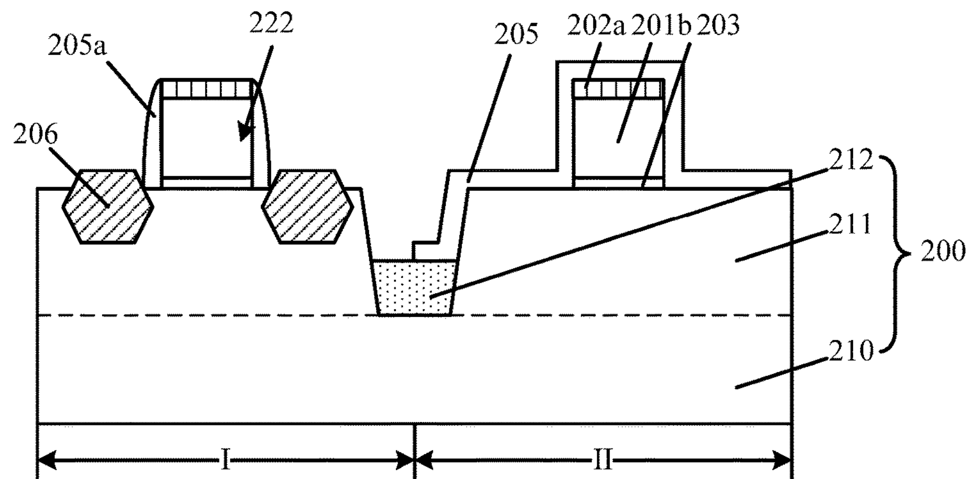

Returning to FIG. 19, after forming the sidewall film 205, a first sidewall spacer may be formed; and a first stress layer may be formed (S108). FIG. 13 illustrates a corresponding structure.

As shown in FIG. 13, a first sidewall spacer 205*a* is formed on the surface of the protection layer 204 (not shown) in the first region I and the second side surface 222 of the gate layer 201 by etching the sidewall film 205 in the first region I (referring to FIGS. 11~12). Further, a first stress layer 206 is formed inside the fins 211 at both sides of the first sidewall spacer 205*a* in the first region I and both sides of the gate layer 201*b*.

In one embodiment, the first sidewall spacer 205*a* may be located on the side surfaces of the protective layer 204 and the second side surface 222 of the gate layer 201*b*. A patterned layer may formed on the surface of the sidewall film 205 in the second region II before the sidewall film 205 in the first region I is etched (not shown). The patterned layer may be used as an etching mask for the formation of the first sidewall spacer 205*a* and the first stress layer 206 in the first region I.

The patterned layer may be made of any appropriate material. In one embodiment, the patterned layer may be a photoresist layer. A process for forming the photoresist layer may include spin-coating a photoresist film on the surface of the sidewall film 205; and patterning the photoresist film by an exposure and developing process to expose the sidewall film 205 in the first region I to form a patterned photoresist layer.

After forming the patterned layer, the sidewall film 205 in the first region I may be etched until the side and the top surfaces of the fins 211 and the surface of the insulation layer 212 are exposed. In certain other embodiments, when the surfaces of the fins 211 and the insulation layer 212 are covered with the gate dielectric layer 203, the etch-back process may be stopped when the surface of the gate dielectric layer 203 is exposed. That is, the gate dielectric layer 203 may be used to protect the surface of the fins 211.

After the etch-back process, the surfaces of the fins 211 at both sides of the sidewall spacer 205*a* and the gate layer 201*b* may be exposed. Thus, the first stress layer 206 may be formed in the exposed fins 211 at both sides of the first sidewall spacer 205a and the gate layer 201b. The first stress layer 206 may be used to increase the compressive stress of the channel region in the fins 211 to increase the carrier mobility.

A process for forming the first stress layer 206 may include forming first openings (not shown) in the fins 211 at both sides of the first sidewall spacer 205a and the gate layer 201b; and followed by forming the first stress layer 206 in the first openings by a selective epitaxial deposition process.

In one embodiment, the first region I of the substrate 200 is used to form a PMOS transistor. Therefore, the first stress layer 206 formed in the first region I may be made of silicon germanium. The first stress layer 206 may be doped with P-type ions to form the source region and the drain region.

Further, as shown in FIG. 13, in one embodiment, the sidewalls of the first openings in the first region I are "Σ" (Sigma) shaped to the top surface of the fins 211. The sidewalls of the first openings in the first region I may have vertexes extending inside the fins 211 at the bottom of the gate layer 201.

A process for forming the first openings in the first region I may include forming openings (not shown) in the fins 211 at both sides of the gate layer 201 and the first sidewall spacer 205a by an isotropic dry etching process, the side surfaces of the openings may be perpendicular to the top surface of the fins 211; and etching the side surfaces and the bottom of the openings with an isotropic wet etching process. After the wet etching process, the surfaces of the openings may be "Σ" shaped to the top surface of the fins 211. In one embodiment, the crystal orientation on the top surface of the fins 211 may be <100> or <110>. Since the etching rate of the isotropic wet etching process is higher on directions perpendicular and parallel to the top surface of the fins 211, and lower on the direction of <111> crystal orientation, the first openings may be "Σ" shaped to the surface of the substrate 200.

The first stress layer 206 in the first region I may be made of any appropriate material. In one embodiment, silicon germanium is used for the first stress layer 206 in the first region I.

Various processes may be used to form the first stress layer 206, such as a CVD process, a PVD process, or an epitaxial growth process. In one embodiment, the first stress layer 206 is formed by a selective epitaxial deposition process. When the first stress layer 206 is formed by a selective epitaxial deposition process, P-type ions may be doped into the first stress layer 206 by an in situ doping process. In certain other embodiments, after forming the first stress layer 206, the source region and the drain region are formed in the stress layer 206 at both sides of the gate layer 201b and portions of the fins 211 by an ion implantation process. The doped ions are P-type ions.

In one embodiment, the first side surfaces 221 of the gate layer 201b may be covered by the protective layer 204, and the top of the protective layer 204 and the gate layer 201b may be covered by the mask layer 202a. Thus, during the etch-back process for forming the first sidewall spacers 205a, the first sidewall spacer 205a may only expose the surface of the protective layer 204. Therefore, the formation of EPI particles on the surface of the gate layer 201b during the formation of the first stress layer 206 may be avoided; and the desired morphology of the gate layer 201b may be ensured.

Figure 14:
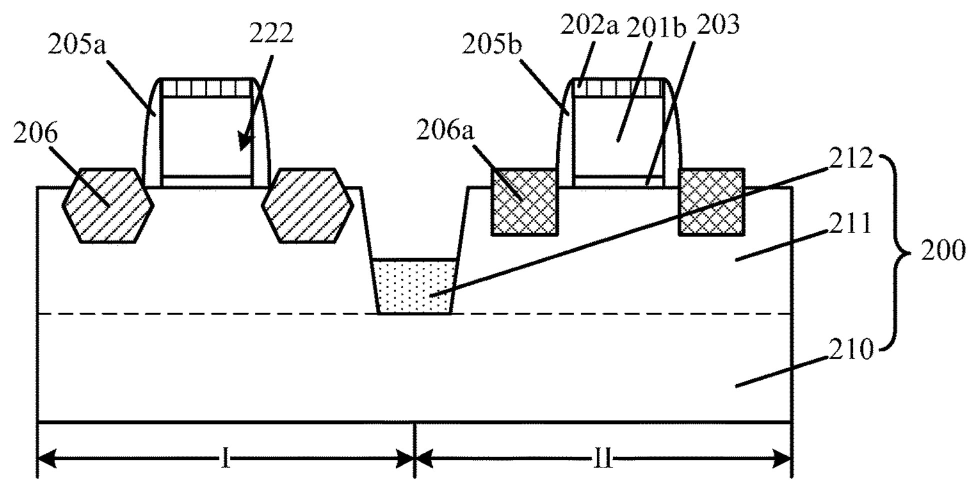

Returning to FIG. 19, after forming the first stress layer 206 in the first region I, a second sidewall spacer and a second stress layer may be formed in the second region II (S109). FIG. 14 illustrates a corresponding structure.

As shown in FIG. 14, a second sidewall spacer 205b is formed. The second sidewall spacer 205b may be formed on the surfaces of the protection layer 204 (not shown) and the second side surfaces of the gate layer 201b in the second region II by etching the sidewall film 205 in the second region II (as illustrated in FIG. 11 and FIG. 12). The second sidewall spacer 205b may be identical to the first sidewall spacer 205a. Further, a second stress layer 206a is formed in the fins 211 at both sides the second sidewall spacer 205b and both sides of the gate layer 201 in the second region II.

Before etching the sidewall film 205 in the second region II to form the second sidewall spacer 205b, a patterned layer may formed on the structures in the first region I (not shown) to protect the structures in the first region I. The patterned layer may be used as the etching mask to form the second sidewall spacer 205b and the second stress layer 206a in the second region II. In one embodiment, the patterned layer is a photoresist layer. A process for forming the patterned layer may identical to the corresponding description for FIG. 13.

After forming the patterned layer, the sidewall film 205 in the second region II may be etched by an isotropic etching process until the side and the top surfaces of the fins 211 and the surface of the insulation layer 212 are exposed, i.e., an etch-back process. In certain other embodiments, when the fins 211 and the surface of the insulation layer 212 are covered with the gate dielectric layer 203, the etch-back process may be performed until the surface of the gate dielectric layer 203 is exposed. The gate dielectric layer 203 may be used to protect the surface of the fins 211.

After the etch-back process, the surfaces of the fins 211 at both sides of the second sidewall spacer 205b and both sides of the gate layer 201b may be exposed. Thus, the second stress layer 206a may be formed in the exposed fins 211 at both sides of the gate layer 201b. The second stress layer 206a may be used to enhance the tensile stress of the channel region in the fins 211, and increase the carrier mobility.

A process for forming the second stress layer 206a may include forming second openings in the fins 211 at both sides of the second sidewall spacer 205b and the gate layer 201; and forming the second stress layer 206a in the second openings by a selective epitaxial deposition process.

In one embodiment, the second region II of the substrate 200 may be used to form an NMOS transistor. Therefore, the second stress layer 206a formed in the second region II may be made of silicon carbide. The second stress layer 206a may need to be doped with N-type ions to form a source region and a drain region. Since the carriers for NMOS transistor are electrons with high electromigration, the sidewalls of the second openings in the second region II may be perpendicular to the top surface of the fins 211.

The second openings in the second region II may be formed by any appropriate process, such as a dry etching process, a wet etching process, or an ion beam etching process, etc. In one embodiment, the second openings in the second region II are formed by an isotropic dry etching process.

The second stress layer 206a formed in the second region II may be made of any appropriate material. In one embodiment, silicon carbide is used as the second stress layer 206a. When the second stress layer 206a is formed by a selective epitaxial deposition process, N-type ions may be doped by an in situ doping process. In certain other embodiments, after forming the second stress layer 206a, an ion implantation process may be used to form the source region and the drain region in the stress layer 206 at both sides of the gate layer 201 and portions of the fins 211. The doped ions are N-type ions.

In one embodiment, after forming the second stress layer 206*a*, a dielectric layer (not shown) may be formed on the surface of the substrate 200. The surface of the dielectric layer may be on the same level or higher than the top surface of the gate layer 201*b*. After removing the mask layer 202*a* and the gate layer 201*b* to expose the surface of the substrate 200, third openings may be formed in the dielectric layer. Subsequently, a high-K gate dielectric layer may be formed on the side surfaces and the bottom of the third openings, and a metal gate may be formed on the surface of the high-K gate dielectric layer to fill the third openings. Thus, HKMG structures of the transistors may be formed; and fin field-effect transistors may be formed.

Therefore, a semiconductor structure with a plurality of transistors may be formed by the above disclosed processes and methods; and the corresponding semiconductor structure is illustrated in FIG. 14. As shown in FIG. 14, the semiconductor structure may include a substrate having a base 210, a fin 211 and an insolation layer 211, the base 200 may have first region I and a second region II, the fin 211 may be separated into at least two portions by the insulation layer 211, one portion is in the first region I and the other portion is in the second region II. The semiconductor structure may also include a gate layer 201*b* formed over the fin 211 and a gate dielectric layer 203 formed between the gate layer 201*b* and the fin 211.

Further, the semiconductor structure may include a first sidewall spacer 205*a* and a protective layer 204 (not shown) formed on the side surfaces of the gate layer 201*b* in the first region I; and a second sidewall spacer 205*b* and a protective layer (not shown) on the side surfaces of the gate layer 201*b* in the second region II. Further, the semiconductor structure may also include first source/drain regions 206*a* formed the in fins 211 at both sides of the first sidewall spacer 205*a* in the first region I; and second source/drain regions 206*b* formed in the fins 211 at both sides of the second sidewall spacers 205*b* in the second region II. Further, the semiconductor structure may include a mask layer 202*a* formed on gate layer 201*b*. The detailed structures and intermediate structures are described above with respect to the fabrication processes FIGS. 15~18 illustrate another exemplary fabrication process of transistors consistent with the disclosed embodiments. For illustrative purposes, the following description is started from the structure illustrated in FIG. 4.

Figure 15:
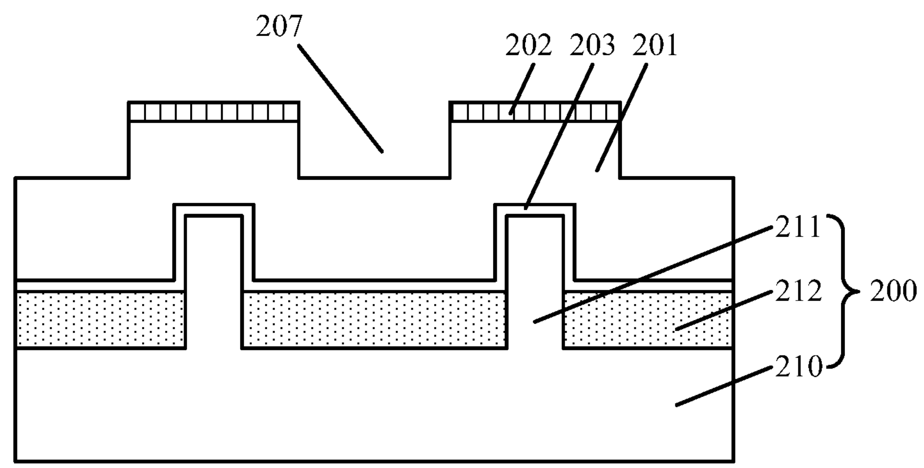
FIG. 15~18 illustrate semiconductor structures corresponding to certain stages of another exemplary fabrication process of transistors consistent with the disclosed embodiments.

As shown in FIG. 15 and FIG. 4, after forming the initial mask layer 202, gate trenches 207 may be formed in the gate film 201 by etching portions of the gate film 201 using the initial mask layer 202 as an etching mask. The cross-sectional direction of FIG. 15 is same as the cross-sectional direction of FIG. 4.

The gate trenches 207 may be formed by any appropriate etching process, such as a dry etching process, a wet etching process, an ion beam etching process, or a combination of thereof. The side surfaces of the gate trenches 207 may be used for forming a protective layer. The protective layer may cover only the top portions of the side surfaces of subsequently formed gate. In one embodiment, the side surfaces of the gate trenches 207 parallel to the longitudinal direction of the fins 211 may be portions of first side surface of the subsequently formed gate layer. The length of the gate trenches 207 along the longitudinal direction of the fins 211 may be greater than that of the subsequently formed gate layer along the longitudinal direction of the fins 211.

Figure 16:
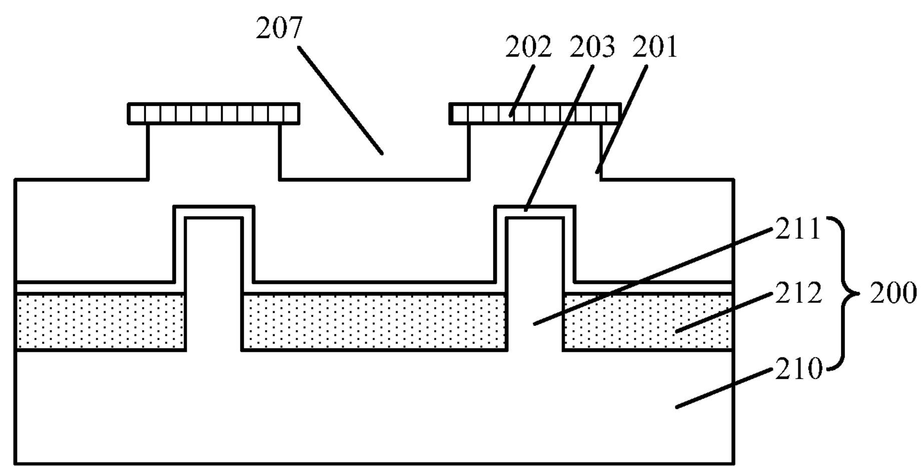

Further, as shown in FIG. 16, after forming the gate trenches 207, the sidewalls of the gate trenches 207 may be recessed relative to the side surfaces of the initial mask layer 202. That is, the portions of the gate film 201 between adjacent gate trenches 207 may be thinned. The thickness to be thinned on the side surfaces of gate trenches 207 relative to the side surfaces of the initial mask layer 202 may be in a range of approximately 20 Å~200 Å.

Various processes may be used to thin the side surfaces of the gate trenches 207. In one embodiment, an isotropic etching process is used. The isotropic etching process for thinning the side surfaces of gate trenches 207 may be a dry etching process or a wet etching process.

Figure 17:
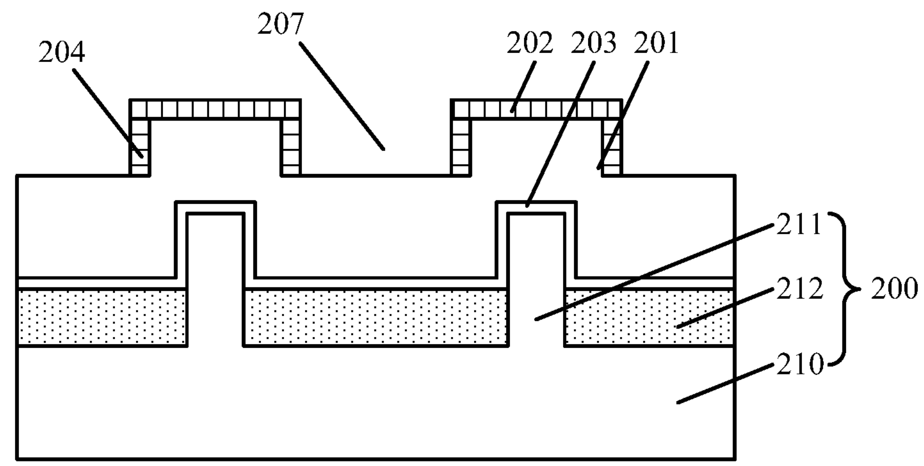

Further, as shown in FIG. 17, after thinning the side surfaces of the gate trenches 207, a protective layer 204 may be formed on the thinned side surfaces of the gate trenches 207. A process for forming the protective layer 204 may include forming a protective film at the bottom and on the thinned side surfaces of the gate trenches 207, and on the surface of the initial mask layer 202; and forming the protective layer 204 by etching the protective film until the top surface of the initial mask layer 202 and the bottom surface of the gate trenches 207 are exposed.

The protective layer 204 may made of any appropriate material, such as one or more of SiN, SiON, SiOBN, SiOCN, and $SiO_2$, etc. The thickness of the protective layer 204 may be in a range of approximately 20 Å~200 Å. The protective film may be formed by any appropriate process, such as an ALD process, or a CVD process, etc.

In one embodiment, the protective layer 204 is made of $SiO_2$. A process for forming the protective layer 204 may include forming a protective film on the side surfaces of the sidewalls of the gate film 201, and the side and the top surfaces of the fins 211 (not shown) by an oxidation process; and forming the protection layer 204 by etching the protective film until the side and the top surfaces of the fins 211 are exposed (not shown).

Figure 18:
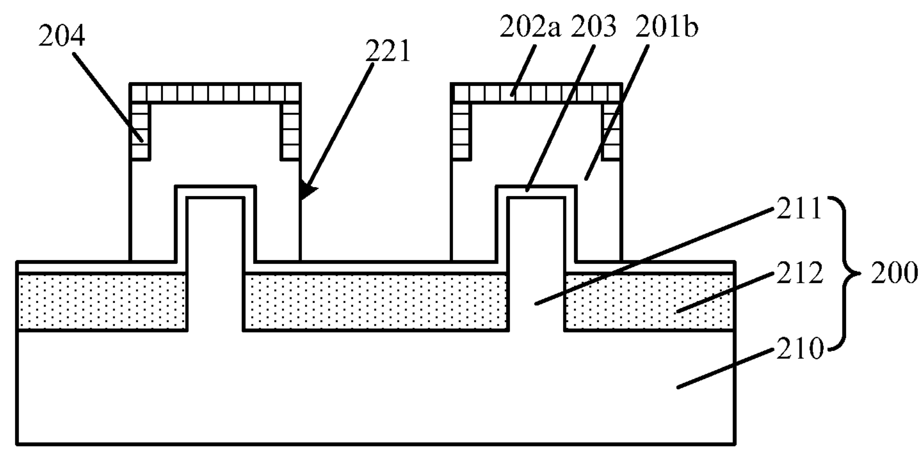

Further, as shown in FIG. 18, after forming the protective layer 204, a gate layer 201*b* and a mask layer 202*a* may be formed by etching the initial mask layer 202 (as illustrated in FIG. 17) and the gate film 201 (as illustrated in FIG. 17) until portions of the side and the top surfaces of the fins 211 and the surface of the insulation layer 212 are exposed.

The gate layer 201*b* may be over the fins 211; and the gate layer 201*b* may be over portions of the surface of the insulation layer 212, and the side and the top surfaces of the fins 211. The mask layer 202*a* may be on the top surface of the gate layer 201*b*. The gate layer 201*b* may include first side surfaces 221 and second side surfaces (not shown). The first side surfaces 221 may be parallel to the longitudinal direction of the fins 211; and the second side surfaces may be perpendicular to the longitudinal direction of the fins 211. The protective layer 204 may be formed on the top portion of the first side surfaces 221.

Further, as shown in FIG. 18, the side surfaces of the gate trenches 207 and the side surfaces formed by etching the gate film 201 at the bottom of the gate trenches 207 may be configured as the first side surfaces 221 of the gate layer 201*b*. The side surfaces of the gate layer 201*b* perpendicular to the first side surfaces 221 may be configured as the second sidewalls.

In one embodiment, the protective layer 204 is only located at the top portions of the first side surfaces 221. The subsequently formed sidewall spacers may be located at the the second side surfaces, the protective layer 204 and portions of the first side surfaces 221 exposed by the protective layer 204.

After forming the gate layer 201, a sidewall spacer may be formed on the surface of the protective layer 204 and the side surfaces of the gate layer 201*a*. A stress layer may be formed in the fins 211 at both sides of the sidewall spacer and the gate layer 201*b*. The details for the formation of sidewall spacer and stress layer are identical to those described in FIG. 11~14.

According to the disclosed methods and structures, a protective layer is formed on the top portions of the first side surface of the gate layer, or the entire first side surfaces of the gate layer. The first side surfaces are parallel to the longitudinal direction of the fins. The protective layer may prevent the exposure of the top portion of the first side surfaces. Thus, the protective layer and the mask layer may protect the vertexes formed by the first side surfaces and the top surface of the gate layer from being exposed. Therefore, after forming the sidewall spacers, the formation of EPI particles on the vertexes of the top of the gate layer may be prevented during the formation of the stress layer. It may ensure the gate layer to have desired morphology; and the leakage current at the top of the gate layer may be prevented.

Further, the stress layer is formed inside the fins at both sides of the sidewall spacers and the gate layer. The second side surface is perpendicular to the longitudinal direction of the fins. The stress layer may be used to form the source region and the drain region. The fins between the source region and the drain region may be used to form the channel region of the transistor. Thus, the channel length may be defined by the distance between the source region and the drain region. Because the protective layer is only formed on the first side surfaces but not on the second side surfaces, the channel length may be more precisely controlled; and the performance of the transistor may be more stable.

Further, a gate film is formed on the surfaces of the insulation layer and the fins before forming the protective layer. Portions of the gate film may be etched to form the initial gate layer using the initial mask layer as the etching mask. After the initial gate layer is thinned, a protective layer completely covering the surface of the first side surfaces of the initial gate layer is formed. The side surfaces of the initial gate layer are recessed relative to the side surfaces of the initial mask layer. Therefore, the top of the protective layer may be covered by the mask layer, and may unlikely to be consumed during the subsequent formation of the sidewall spacers. Further, the first side surfaces and the vertexes near the top of the gate layer may not be exposed after forming the sidewall spacers. Thus, the formation of the EPI particles on the vertexes of the top of the gate layer may be prevented.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating transistors, comprising:

providing a substrate having a base and at least a fin on the base;

forming an initial gate layer to envelop the fin having a length, the initial gate layer has first side surfaces parallel with a length direction of the fin and second side surfaces perpendicular to the length direction of the fin;

forming an initial mask layer on a top surface of the initial gate layer;

forming a protective layer on the first side surfaces of the initial gate layer parallel with the length direction of the fin, such that the initial mask layer further covers and connects to a top surface of the protective layer to protect top vertexes of the initial gate layer;

removing portions of each of the initial mask layer and the initial gate layer from the fin, thereby providing a mask layer and a gate layer on a length portion of the fin having exposed fin on both sides of the gate layer;

forming a sidewall spacer on side surfaces of the protective layer and the second side surfaces of the gate layer; and forming a stress layer in the fin at both sides of the sidewall spacer and the gate layer.

2. The method according to claim 1, further including:

forming an insulation layer on the base, wherein the insulation layer covers portions of side surfaces of the fin, and a top surface of the insulation layer is lower than a top surface of the fin.

3. The method according to claim 1, wherein:

the protective layer covers the entire first side surfaces of the gate layer.

4. The method according to claim 2, wherein forming the gate layer and the protective layer further includes:

forming a gate film on surfaces of the insulation layer and the fin;

forming the initial mask layer on a surface of the gate film, a projective view of the fin on the surface of the base is within a projection view of the initial mask layer on the surface of the base;

etching the gate film using the initial mask layer as an etching mask to form a first initial gate layer until the surface of the insulation layer is exposed;

thinning the first initial gate layer to recess the first initial gate layer relative to side surfaces of the initial mask layer, thereby providing the initial gate layer;

forming the protective layer on the first side surfaces of the initial gate layer; and forming the gate layer and the mask layer by etching the initial mask layer and the initial gate layer until portions of top and side surfaces of the fins and a top surface of the insulation layer are exposed.

5. The method according to claim 4, wherein forming the protective layer further includes:

forming a protective film on the surfaces of the insulation layer, the sidewalls of the initial gate layer and the initial mask layer; and performing an etch-back process on the protective film to form the protective layer until the top surface of the initial mask layer and the surface of the insulation layer are exposed.

6. The method according to claim 2, wherein the initial gate layer are thinned by an isotropic etching process.

7. The method according to claim 2, wherein forming the gate layer and the protective layer further includes:

forming a gate film on surfaces of the insulation layer and the fins;

forming an initial mask layer on a surface of the gate film, a projective view of the fins on the surface of the base is within the projective view of the initial mask layer on the surface of the base;

etching portions of the gate film using the initial mask layer as an etching mask to form gate trenches in the gate film;

recessing the sidewalls of the gate trenches relative to side surfaces of the initial mask layer;

forming the protective layer on sidewalls of the gate trenches; and forming the gate layer and the mask layer by etching the initial mask layer and the initial gate layer until the portions of the top and the side surfaces of the fins and the surface of the insulation layer are exposed.

8. The method according to claim 7, wherein forming the protective layer further includes:

forming a protective film on the bottom and side surfaces of the gate trenches and the surface of the initial mask layer; and performing an etch-back process on the protective film to form the protective layer until the top surface of the initial mask layer and the surface of the bottom of the gate trenches are exposed.

9. The method according to claim 1, wherein forming the sidewall spacers further includes:

forming a sidewall film on the surfaces of the insulation layer, the sidewalls of the gate layer, the protective layer and the mask layer; and performing an etch-back process on the sidewall film to form the sidewall spacers until the surface of the insulation layer, the side and the top surfaces of the fins, and the top surface of the mask layer are exposed.

10. The method according to claim 1, wherein forming of the stress layer further includes:

forming first openings in the fins on the both sides of the sidewall spacer and the gate layer; and forming the stress layer in the first openings by a selective epitaxial deposition process.

11. The method according to claim 1, further including:

forming a gate dielectric layer between the gate layer and the substrate.

12. The method according to claim 1, wherein:

the stress layer is made of one of silicon germanium and silicon carbide.

13. The method according to claim 12, wherein:

the stress layer is doped with P-type ions when the stress layer is made of silicon germanium; and the stress layer is doped with N-type ions when it is made of silicon carbide.

14. A semiconductor structure having at least a transistor, comprising:

a substrate having a base and at least a fin on the base;

a gate layer across a length portion of the fin and having first side surfaces parallel with a length direction of the fin and second side surfaces perpendicular to the length direction of the fin formed on the fin;

a protective layer formed on the first side surfaces of the gate layer, parallel with the length direction of the fin;

a mask layer formed on a top surface of the gate layer and on a top surface of the protective layer;

sidewall spacers formed on side surfaces of the protective layer and the second side surfaces of the gate layer; and a stress layer formed in the fin at both sides of the sidewall spacers and the gate layer.

15. The semiconductor structure according to claim 14, wherein:

the protective layer is made of one or more of SiN, SiON, SiOBN, SiOCN, and $SiO_2$; and a thickness of the protective layer is in a range of approximately 20 Å~200 Å.

16. The semiconductor structure according to claim 14, wherein:

the stress layer is made of one or more of silicon germanium and silicon carbide.

17. The semiconductor structure according to claim 14, wherein:

the gate layer is made of one of amorphous silicon or polysilicon.

18. The semiconductor structure according to claim 14, wherein:

the substrate has a first region and a second region;

a PMOS transistor and an NMOS transistor are formed in the first region and the second region, respectively; and the stress layer formed in first region is made of a material different from that of the stress layer formed in the second region.

19. The semiconductor structure according to claim 14, further including:

a gate dielectric layer formed between the gate layer and the substrate, the gate dielectric layer is made of silicon oxide.

20. The semiconductor structure according to claim 14, wherein:

the protective layer is located at least on an upper portion of the first side surfaces of the gate layer to protect top vertexes of the gate layer.

* * * * *